US008133819B2

(12) United States Patent
Wang et al.

(10) Patent No.: US 8,133,819 B2
(45) Date of Patent: Mar. 13, 2012

(54) PLASMA ETCHING CARBONACEOUS LAYERS WITH SULFUR-BASED ETCHANTS

(75) Inventors: Judy Wang, Cupertino, CA (US); Shawming Ma, Sunnyvale, CA (US); Chang-Lin Hsieh, San Jose, CA (US); Bryan Liao, Santa Clara, CA (US); Jie Zhou, Sunnyvale, CA (US); Hun Sang Kim, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1057 days.

(21) Appl. No.: 12/035,289

(22) Filed: Feb. 21, 2008

(65) Prior Publication Data

US 2009/0212010 A1 Aug. 27, 2009

(51) Int. Cl.
*H01L 21/302* (2006.01)

(52) U.S. Cl. ........... 438/725; 438/706; 438/717; 216/81

(58) Field of Classification Search .................. 438/706, 438/710, 712, 714, 723, 717, 725; 216/58, 216/67, 81

See application file for complete search history.

(56) References Cited

U.S. PATENT DOCUMENTS 4,786,361 A * 11/1988 Sekine et al. .................. 216/37
6,187,688 B1 * 2/2001 Ohkuni et al. ................ 438/725
6,835,663 B2 * 12/2004 Lipinski ....................... 438/695
7,271,106 B2 9/2007 Abatchev et al.
2005/0211385 A1 * 9/2005 Benjamin et al. ........ 156/345.52
2006/0046483 A1 3/2006 Abatchev et al.
2006/0226120 A1 10/2006 Rusu et al.
2006/0270230 A1 11/2006 Abatchev et al.

FOREIGN PATENT DOCUMENTS

CN 1213456 A 4/1999
CN 1956154 5/2007
JP 2004-363150 12/2004

OTHER PUBLICATIONS

Notice of Preliminary Rejection for Korean Application No. 10-2008-0062505, issued Nov. 23, 2009, 2 pages.
First OA for Chinese Application No.200810128783.6, mailed Mar. 2, 2010, 18 pages.
Notice of Rejection for Korean Application No. 10-2008-0062505, issued May 28, 2010, 5 pages.

* cited by examiner

*Primary Examiner* — Lan Vinh
(74) *Attorney, Agent, or Firm* — Blakely, Sokoloff, Taylor & Zafman

(57) ABSTRACT

Etching of carbonaceous layers with an etchant gas mixture including molecular oxygen ($O_2$) and a gas including a carbon sulfur terminal ligand. A high RF frequency source is employed in certain embodiments to achieve a high etch rate with high selectivity to inorganic dielectric layers. In certain embodiments, the etchant gas mixture includes only the two components, COS and $O_2$, but in other embodiments additional gases, such as at least one of molecular nitrogen ($N_2$), carbon monoxide (CO) or carbon dioxide ($CO_2$) may be further employed to etch to carbonaceous layers.

18 Claims, 6 Drawing Sheets

100
START
ETCH CAP LAYER WITH HALOGEN ETCHANT GAS — 120
PURGE HALOGEN ETCHANT — 125
ETCH AMORPHOUS CARBON LAYER WITH HALOGEN FREE GAS MIXTURE COMPRISING $O_2$ AND COS — 130
ETCH FIRST SUBSTRATE LAYER WITH HALOGEN ETCHANT — 140
STRIP AMORPHOUS CARBON — 150
END

| | Parameter | Trend | Bowing | BCD | ER | Etch Stop Window | Selectivity to CAP |
|---|---|---|---|---|---|---|---|
| | COS/O2 ratio | ↑ | ↓ | ↓ | ↓ | ↓ | ↑ |
| | Total COS/O2 flow | ↑ | – | ↓ | ↑ | ↓ | ↑ |
| | process pressure | ↑ | ↑ | ↑ | ↑ | ↓ | ↑ |
| | power (162 MHz) | ↑ | | | ↑ | ↑ | ↑ |
| | power (13.56 MHz) | ↑ | | ↓ | ↑ | | — |
| | power (2 MHz) | ↑ | | ↑ | ↑ | | — |
| | workpiece temp | ↑ | | | ↑ | ↑ | ↑ |

FIG. 4

PLASMA ETCHING CARBONACEOUS LAYERS WITH SULFUR-BASED ETCHANTS

BACKGROUND

1. Field

Embodiments of the present invention relate to the electronics manufacturing industry and more particularly to the process of plasma etching features in carbonaceous layers.

2. Discussion of Related Art

As the feature size of the device patterns get smaller than 100 nm, the critical dimension (CD) requirement of features becomes a more important criterion for stable and repeatable device performance. Allowable CD variation across a substrate has also scaled with the scaling of feature CD. For example, across a 300 mm diameter substrate, some applications may demand a 3-sigma of less than 10 nm for a target CD averaging about 80 nm.

Also, with lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

SUMMARY

In embodiments of the present invention, etching of carbonaceous layers, such as amorphous carbon, with an etchant gas mixture including molecular oxygen ($O_2$) and a gas including a carbon sulfur terminal ligand, is described. In certain embodiments, the etchant gas mixture is halogen-free and in particular embodiments, the etchant gas mixture includes only two components, such as COS and $O_2$. In other embodiments, additional gases, such as at least one of molecular nitrogen ($N_2$), carbon monoxide (CO),carbon dioxide ($CO_2$), ozone ($O_3$), water ($H_2O$), hydrogen peroxide ($H_2O_2$) or a fluorocarbon may be further combined with $O_2$ and the sulfur-containing gas to etch to a carbonaceous layer.

In an embodiment, the COS:$O_2$ volumetric flow rate between about 0.25 and about 1.0 is energized with a capacitively coupled high frequency RF generator, having a frequency above about 100 MHz, to etch a carbonaceous layer with selectivity over a masking inorganic dielectric cap layer greater than at least 30:1 and preferably greater than 50:1 while incurring minimal bowing in sidewalls of HAR features, such as contact patterns. The COS:$O_2$ etchant gas mixture may be advantageously further energized with one or more low frequency RF generators, having a frequency below about 60 MHz to further tune the feature CD uniformity.

In still other embodiments, an etchant gas mixture including a gas having a carbon sulfur terminal ligand is delivered to the plasma etch chamber with a gas flow rate at a first gas inlet proximate to a substrate center different than the gas flow rate at a second orifice proximate to the substrate periphery while the plasma is exposed to a magnetic field strength proximate to the substrate center different than the magnetic field strength proximate to the substrate periphery to further improve uniformity of the carbonaceous layer etch.

In one exemplary implementation, where a multi-layered mask includes an amorphous carbon layer disposed on a substrate layer, an inorganic dielectric cap layer disposed on the amorphous carbon layer and a patterned photoresist layer disposed over the inorganic dielectric cap layer, the inorganic dielectric cap layer is first etched with an etchant gas mixture including a fluorocarbon, the etch process chamber purged of halogen and the amorphous carbon layer etched with an etchant gas mixture including $O_2$ and a gas having a carbon sulfur terminal ligand.

Other aspects provide for a plasma etching apparatus configured to perform etching of a carbonaceous layer with an etchant gas mixture including a gas having a carbon sulfur terminal ligand mixed with $O_2$. Still other aspects provide for computer readable media containing instructions for performing such etch methods on a capacitively coupled high frequency plasma etching apparatus.

BRIEF DESCRIPTION OF THE DRAWINGS

FIG. 4 depicts a process trend summary of a method to etch an amorphous carbon layer with an etchant mixture including COS and $O_2$, in accordance with a particular embodiment.

DETAILED DESCRIPTION

In the following description, numerous specific details are set forth to provide a thorough understanding of the present invention. It will be apparent to one skilled in the art that the present invention may be practiced without these specific details. In other instances, well-known features, such as specific lithographic patterning and etching techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Also, it is to be understood that the various exemplary embodiments shown in the Figures are merely illustrative representations and are not necessarily drawn to scale.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
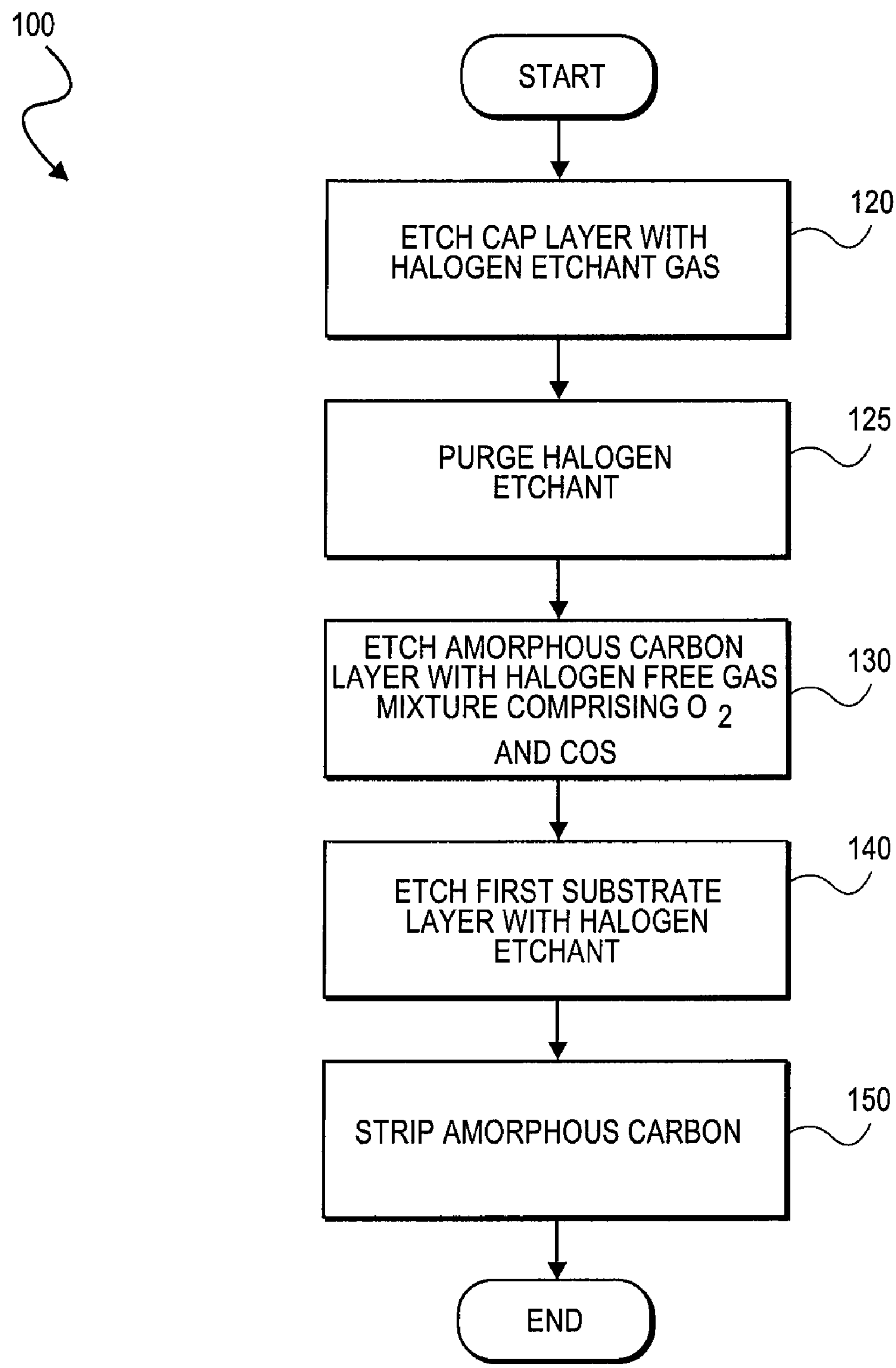
FIG. 1 is a flow chart depicting a method of etching a feature with a multi-layered mask where an amorphous carbon layer of the multi-layered mask is etched with COS mixed with $O_2$, in accordance with a particular embodiment.

FIG. 1 illustrates a flow chart of method 100 for etching a feature in accordance with one embodiment of the present invention. Method 100 is performed upon a substrate during the fabrication process. FIGS. 2A-2F illustrate cross-sectional views of an exemplary substrate having a feature fabricated in accordance with a particular implementation of the flow illustrated in FIG. 1.

Figure 2A:
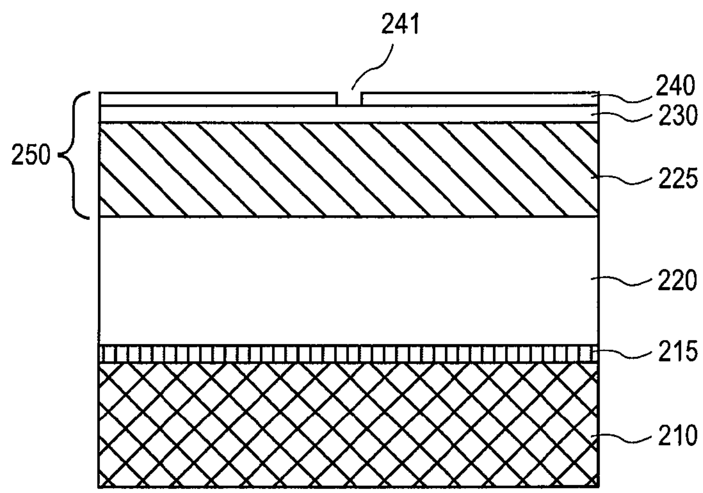
FIGS. 2A, 2B, 2C, 2D, 2E and 2F are cross sectional illustrations depicting an exemplary implementation of the method of FIG. 1, whereby features are etched into a multilayer mask with an etchant gas mixture including COS and $O_2$, in accordance with one embodiment.
Figure 2B:
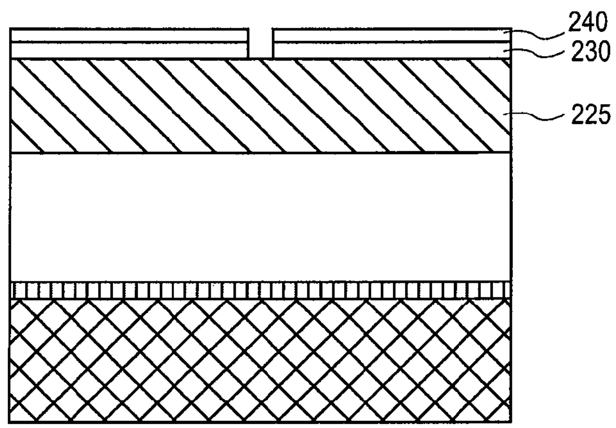
Figure 2C:
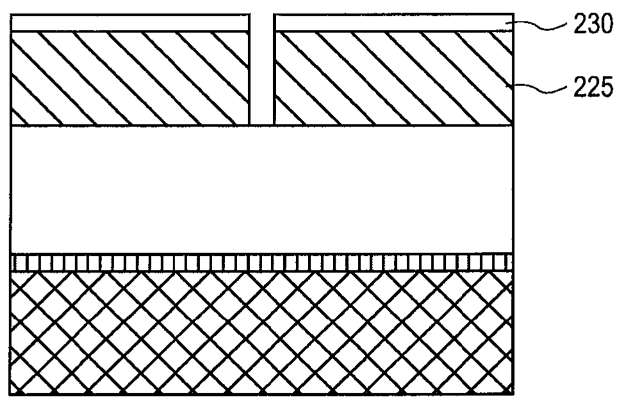
Figure 2D:
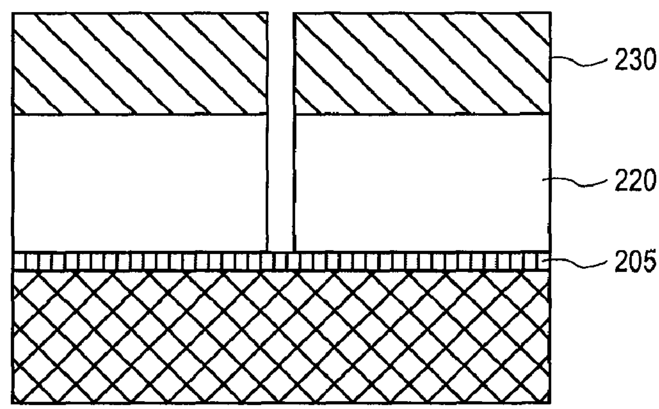
Figure 2E:
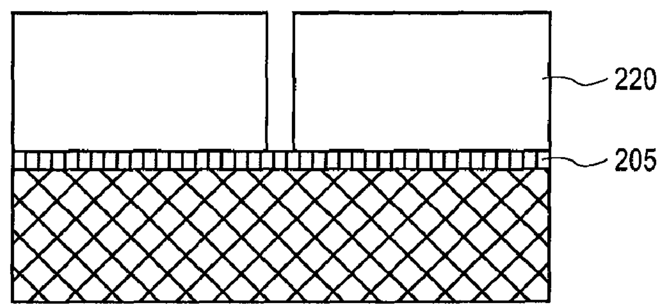

The method 100 of FIG. 1 begins with workpiece, as depicted in FIG. 2A including a substrate layer 220 on a support 210. In one embodiment, support 210 is a semiconductor wafer, such as, but not limited to silicon, germanium, or a commonly known III-V compound semiconductor material. In another embodiment, support 210 is a glass or sapphire material. The substrate layer 220 generally comprises a dielectric layer, such as a silicon dioxide having a dielectric constant of approximately 2.5. In other embodiments, substrate layer 220 comprises a low-k material, having a dielectric constant of about 2.4 or below, such as, but not limited to, carbon doped silicon oxides. It should also be understood that substrate layer 220 may comprise multiple dielectric, semiconductor, or conductor layers of various materials commonly known in the art. In the particular embodiment depicted in FIG. 2A, the substrate layer 220 is on an etch stop layer 215, where etch stop layer 215 comprises a material known to have good selectivity to processes employed for etching the substrate layer 220. In one implementation where the substrate layer 220 comprises silicon dioxide, the etch stop layer 215 comprises silicon nitride.

As further depicted, a carbonaceous layer, such as the amorphous carbon layer 225, is formed over the substrate layer 220. As used herein, a carbonaceous layer includes inorganic layers comprising at least 20 wt % carbon. Included in this class of materials is amorphous carbon, typically comprising greater than 50 wt % carbon, and low-k dielectrics comprising at least 20 wt % carbon content. Excluded from the "carbonaceous" class are organic materials having a total carbon content less than 20 wt %, such as those commonly employed as bottom anti-reflective coating (BARC) layers, which typically comprise polyamides and polysulfones and have less than 5 wt % carbon.

The carbonaceous layer may be formed with spray on/spin on methods, with a thermal deposition process (CVD), or a plasma enhanced deposition process (PECVD). In the embodiment depicted in FIG. 2A, amorphous carbon layer 225 is deposited with either CVD or PECVD to form a carbon material comprising at least 50 wt % carbon with sp1, sp2 and sp3 bonding states giving the film properties which are a hybrid of those typical of pyrolylic, graphitic, and diamond-like carbon. Because the deposited carbon material may contain a plurality of bonding states in various proportions, it lacks long rang order and so is commonly referred to as "amorphous carbon." In particular embodiments, the amorphous carbon layer 225 may be formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$), toluene ($C_7H_8$ ($C_6H_5CH_3$)) and mixtures thereof. The amorphous carbon layer 225 may also include nitrogen or other additives. An exemplary amorphous carbon material is commercially available from Applied Materials, Inc., CA, U.S.A. under the trade name Advanced Patterning Film™ (APF). Though not depicted, in another embodiment at the lower end of the carbon wt % range, the carbonaceous layer is a low-k dielectric, such as that commercially available from Applied Materials, Inc., under the trade name of Black Diamond™.

Amorphous carbon layer 225 is not photosensitive and is instead patterned with a plasma etch to reproduce with high fidelity a pattern of an overlying photosensitive layer. While amorphous carbon layer 225 provides additional thickness to the mask much like a traditional hard mask (employing a nitride or oxide of silicon), it is advantageous because the amorphous carbon layer 225 can be readily removed with the same methods used to remove a photosensitive layer, for example, with a high frequency $O_2$ plasma strip.

The amorphous carbon layer 225 is formed with a thickness dependent the material's resistance to the process used to subsequently pattern substrate layer 220 and the structural integrity of the carbon material (limiting the aspect ratio of the amorphous carbon layer). In one embodiment, the amorphous carbon layer 225 has a thickness which is approximately 5 times greater than the critical dimension of a feature to be subsequently etched into the layer for an aspect ratio of 5:1. In a further embodiment, the ratio of amorphous carbon layer thickness to feature dimension is between 1:1 and 5:1. Such a range of ratios will provide adequate structural integrity so that patterned amorphous carbon features will not collapse during subsequent processing. In one such embodiment, the amorphous carbon layer 225 is between approximately 100 nm and approximately 1000 nm. In a particular embodiment including a substrate layer comprising silicon dioxide approximately 1.5 to 2 um thick, the thickness of the amorphous carbon layer is between approximately 700 nm to 900 nm.

As also depicted in FIG. 2A, the amorphous carbon layer 225 is capped with an inorganic dielectric cap layer 230. Inorganic dielectric cap layer 230 may serve as a dielectric anti-reflective layer (DARC) and/or improve adhesion of subsequent organic films applied by spin on techniques, which may otherwise not adhere well to the amorphous carbon layer 225. Inorganic dielectric cap layer 230 may be a single film or a multi-layered stack of films comprising silicon, nitride, oxygen in the form of silicon dioxide, silicon nitride or silicon oxy-nitride (SiON). The composition and thickness may also be tuned to provide minimal reflections and high contrast for a particular wavelength employed during photolithographic patterning of features. In exemplary embodiments, the inorganic dielectric cap layer 230 is formed to a thickness of between about 25 nm and 100 nm.

As further depicted in FIG. 2A, the multi-layered mask 250 includes a patterned photoresist layer 240 after a photolithography operation. In some photoresist embodiments, an organic BARC is applied on the inorganic dielectric cap layer 230 to further reduce reflection of light during patterning of the photosensitive layer. The BARC typically comprises polyamides and polysulfones. While it is usually unnecessary to have both an organic BARC (not shown) and the inorganic dielectric cap layer 230 over the amorphous carbon layer 225, such a multi-layered mask may nonetheless still be practiced.

The patterned photoresist 240 over the amorphous carbon layer 225 may be patterned with any conventional means, such as with 193 nm photolithography and suitable known resist compositions. In one embodiment, the patterned photoresist 240 includes a contact opening 241 having a critical dimension below about 80 nm. In a specific implementation, patterned photoresist 240 forms a contact opening having a critical dimension between approximately 60 nm and 80 nm.

Returning to FIG. 1, at operation 120, the inorganic dielectric cap layer 230 is etched as further depicted in FIG. 2. In one advantageous embodiment, the inorganic dielectric cap layer 230 is plasma etched with a conventional halogen-based chemistry, including gases such as, but not limited to fluorocarbons like $CF_4$ and $CHF_3$. Mixtures including one or both of these may be combined with or without $N_2$. In a further embodiment, the fluorocarbon etchant gas is energized with a low frequency "bias power" RF generator, having a frequency below about 50 MHz, such as the 13.56 MHz and 2 MHz bands. In a further embodiment, high frequency "source power" RF generation, having a frequency above about 100 MHz is preferentially avoided during opening of the inorganic dielectric cap layer 230 to minimize etch bias. A BARC layer, if present, may also be plasma etched with a substantially similar plasma etch process, such that both the organic layer and the inorganic dielectric cap layer 230 may be etched in a single etch step. The duration of operation 120 is dependent on the thickness of the cap layer(s), but, in one embodiment, a 100 nm inorganic dielectric cap layer 230 is cleared in less than about 100 seconds.

In the embodiment depicted in FIG. 1, at operation 125, the fluorocarbon-based chemistries employed for etching the inorganic anti-reflective cap are purged from the etch process chamber at operation 125, before the amorphous carbon layer 225 is etched. In a particular embodiment, a high volumetric flow of an inert, such as Argon, is introduced to the etch chamber to purge any halogen-based gas from the etch chamber before proceeding with etching of the amorphous carbon layer 225 to prevent carryover of residual halogens into subsequent processes performed in the etch chamber. The presence of fluorine during etch of the amorphous carbon layer 225 has been found, under some circumstances, to damage the amorphous carbon layer 225 and potentially cause a parametric shift in fabricated devices.

Figure 5:
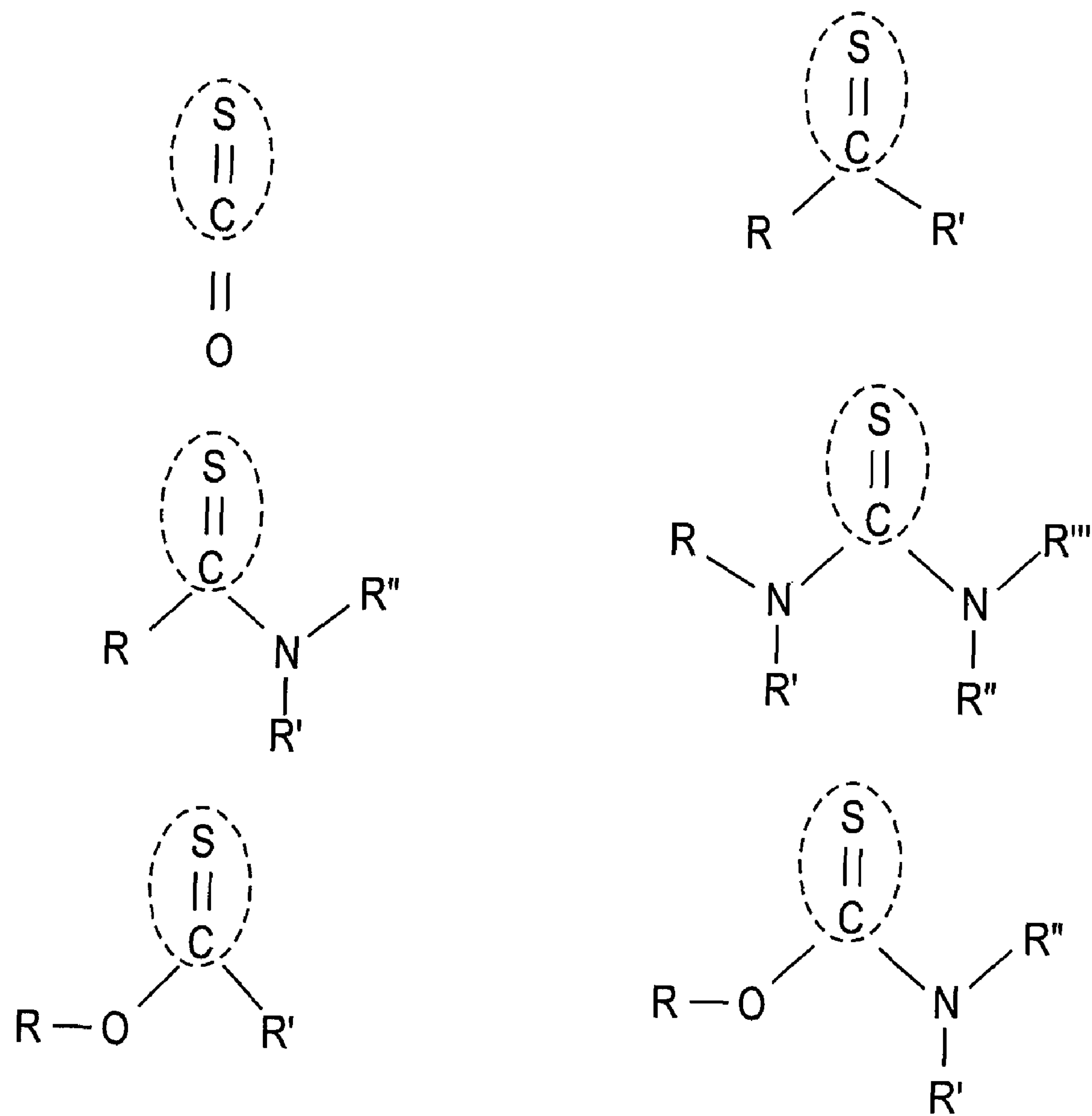
FIG. 5 depicts a group of molecules having a carbon sulfur terminal ligand, in accordance with a particular embodiment.

At operation 130, the amorphous carbon layer 225 is plasma etched with an etchant gas mixture including $O_2$ and a gas comprising a carbon sulfur terminal ligand. Molecules comprising a carbon sulfur terminal ligand are to be distinguished from those with a central sulfur, such as $SF_6$. Molecules having a carbon sulfur terminal ligand include a terminal sulfur atom bonded to a carbon atom. The carbon atom may then be further bonded to other atoms as part of a backbone. FIG. 5 depicts a number of molecules including a carbon sulfur terminal ligand, with the carbon sulfur terminal ligand encircled with a dashed line. The R, R', R" and R"' groups depicted in FIG. 5 each represent an alkyl group, an aryl group or hydrogen atom. Those molecules depicted in FIG. 5 include an asymmetrical carbon sulfur terminal ligand resulting in a non-polar molecule. However, other molecules having a symmetrical carbon sulfur terminal ligand, such as carbon disulfide ($CS_2$) may also be meritorious for the purpose of etching carbonaceous layers. In particular embodiments, the gas comprising a carbon sulfur terminal ligand has the general chemical formula of $(COS)_x$ and in a preferred embodiment, the gas comprising a carbon sulfur terminal ligand is carbonyl sulfide, COS.

It has been found that a gas comprising a carbon sulfur terminal ligand, such as COS, when mixed with $O_2$, provides an advantageously wide process window for etching amorphous carbon films. This has been found to be particularly the case when energized into a plasma with a capacitively coupled etch apparatus operating at high frequencies, above about 100 MHz. The wide process window of the $COS:O_2$ etchant gas combined with high frequency excitation allows for extensive tuning of etch rate and CD uniformity across a substrate. While there are a number of other halogen-free sulfur containing gases, such as sulfur dioxide ($SO_2$) and hydrogen sulfide ($H_2S$), a gas comprising a carbon sulfur terminal ligand, particularly those with a low boiling point, such as COS, have been found to be advantageous for the etching of carbonaceous layers.

When energized with a high frequency RF source power (above about 100 MHz), $O_2$ is capable of etching the amorphous carbon layer 225 at extremely high rates, well over 1 um/min, however yields highly bowed sidewalls and has a low selectivity over most masking films, such as the inorganic dielectric cap layer 230. It has been found that these deficiencies may be greatly improved with the addition of a gas having a carbon sulfur terminal ligand, such as COS, which when energized with a high frequency RF source in the absence of $O_2$, does not etch amorphous carbon at an appreciable rate. Therefore, in particular embodiments where the etchant gas mixture consists essentially of $O_2$ and COS, a rather elegant two component (oxidant and passivant) mixture may provide a robust amorphous carbon etch process having a large process window. In contrast, alternative sulfur-containing gases, such as $SO_2$ and $H_2S$, have not been found to provide a similarly wide process window. Gases such as $SO_2$ and $H_2S$ therefore can not be expected to achieve the same amorphous carbon etch rate, selectivity or uniformity of contact bottom CD across a substrate diameter.

Embodiments including a high frequency RF excitation of $COS:O_2$ etchant mixtures has been found to provide particularly high amorphous carbon etch rates and high selectivity to materials such as the inorganic dielectric cap layer 230. As used herein, high frequency RF refers to "source" powers operating at RF frequencies above about 100 MHz. Low frequency "source" powers operating at RF frequencies below about 60 MHz generally provide a significantly lower etch rate of amorphous carbon layers with $O_2$ than do high frequency sources. This has been found to be the case for capacitively coupled and inductively coupled systems alike. The lower etch rate associated with these low RF frequencies in turn requires compensation with, for example, high $O_2$ flows and high RF powers. As discussed elsewhere herein, both high $O_2$ flow and high powers at low RF frequency are detrimental to maintaining high selectivity to materials such as the inorganic dielectric cap layer 230 and also detrimental to good CD control. For example, an etch apparatus employing a 50 MHz source, such as the eMax system of Applied Materials, Inc. provides about 2.5 to 3 times lower amorphous carbon etch rate with $O_2$ than does the 162 MHz capacitive source of the Enabler from Applied Materials Corp for comparable RF power levels. While higher $O_2$ flow and a 2.5 times higher RF power at a low RF frequency can partially compensate for the lower efficiency and resultant depressed amorphous carbon etch rate, it does so at the expense of a significant loss of selectivity (well below the 30:1 selectivity to inorganic dielectric cap layer 230 required for 11:1 HAR contact etches) and significant loss of bottom CD uniformity across the substrate (3-sigma of at least 13 nm from center to edge). Thus, while $COS:O_2$ etchant gas mixtures described herein are generally applicable to any frequency system and may offer improvements relative to other gas mixtures, such as $O_2$ with CO or $O_2$ with $SO_2$, embodiments where a $COS:O_2$ etchant gas mixture is combined with high frequency RF offers a superior process window.

In particular embodiments, the etch operation 130 includes introducing to an etch chamber a volumetric gas flow ratio of $COS:O_2$ between approximately 0.25:1 and 1:1. A process trend dependent on the mixture ratio is depicted in FIG. 4.

Such mixture ratios of COS and $O_2$ when energized with a high frequency source power, provide amorphous carbon etch rates as high as from 800 nm/second to approximately 1.2 um/second. The relatively high percentage of COS in the etchant mixture enables extensive tuning since the COS is not limited to very low dilutions, such as below about 10%. Thus, the COS:$O_2$ mixtures are relatively insensitive to effects which may lead to across substrate uniformity issues, such as localized species depletion, etc. The COS:$O_2$ gas ratios between approximately 0.25:1 and 1:1 have also been found to provide very high selectivity, well over 30:1, typically at least 50:1 and approaching 100:1, of amorphous carbon over silicon dioxide, silicon nitride or SiON. Alternative sulfur-containing gases, such as $SO_2$ have not been found to have such high selectivity. While not limited by any particular theory, the presence of the carbon sulfur terminal ligand may advantageously provide passivation species over non-carbonaceous surfaces, such as those of silicon dioxide, silicon nitride or SiON that are unavailable in etchant mixtures lacking the carbon sulfur terminal ligand, such as $SO_2$. Energizing the COS:$O_2$ etchant with high frequencies above about 100 MHz may also provide a species in a quantity sufficient to passivate in the absence of a high bias voltage on the substrate. The combination of high etch rate, high selectivity and reduced sidewall bowing of such mixture ratio ratios provide the basis for a wide process window which may then be tailored to achieve excellent uniformities and high throughput of the etch apparatus.

The total flow rate of a COS/$O_2$ etchant gas mixture, as further depicted in FIG. 4, tends to reduce a HAR contact BCD while increasing the amorphous carbon etch rate. Depending on etch chamber configuration, total flow may be anywhere between about 25 sccm and 1000 sccm, or higher. In a particular embodiment having COS:$O_2$ flow rate ratio of approximately 0.30:1, the total flow is approximately 150 sccm. The optimal COS:$O_2$ flow rate ratio is not linear with total flow rate. Very high total flows of the COS/$O_2$ etchant gas in any etch apparatus tend to reduce the process window because the COS:$O_2$ ratio is increased at higher $O_2$ flows to maintain feature profile and CD. For example, as a higher $O_2$ flow rate is employed, a high flow rate of COS may be needed to prevent excessive feature sidewall bowing. At very high total flow rates, non-uniformities across a substrate diameter increase and therefore to maintain a larger process window, relatively low total flows are desirable if a sufficiently high amorphous carbon etch rate can be attained at a lower total COS/$O_2$ flow by means of other process parameters.

While two component COS:$O_2$ etchant mixture embodiments provide a significant reduction in sidewall bowing of HAR contacts in amorphous carbon layers, further improvement in sidewall profile may be attained with the introduction of other species to the etchant mixture. In particular embodiments, the etchant gas mixture further comprises at least one of $N_2$, CO, $CO_2$, $O_3$, $H_2O$, $H_2O_2$. It is also noted that in alternate embodiments, the $N_2$ source may be replaced with other nitrogen sources, such as, but not limited to nitrogen oxides (NO, $N_2O$, etc.) or ammonia ($NH_3$). The etchant gas mixture may further include an inert, such as Ar, He, or Xe.

In certain other embodiments, a first etchant gas mixture including both COS and $O_2$ is utilized in a first portion of an amorphous carbon layer etch and then and a second etchant gas mixture, lacking COS, is employed in a second portion of an amorphous carbon layer etch. In one particular embodiment, a two component etchant mixture of $O_2$ and COS is utilized in a first portion of an amorphous carbon layer etch and then a second two component etch gas mixture of $O_2$ and $N_2$ is utilized in a second portion of an amorphous carbon layer etch. Such a process may be particularly advantageous for very HAR etches to tailor the sidewall profile as the aspect ratio during the first portion reaches about 5:1 to 7:1 and then shifting to the second etchant gas mixture to continue the second portion of the etch to reach aspect ratios of 8:1 or higher. Such multi-step processes have been found to produce essentially vertical contact sidewalls for aspect ratios of about 10:1 while still providing cumulative selectivity over inorganic dielectric materials that is greater than 30:1. It should be appreciated other embodiments include variations on this theme, whereby the COS gas component is pulsed while an etch proceeds through an amorphous carbon layer, with or without pulsing of an alternate component such as $N_2$, CO, or $CO_2$.

Process pressure, when increased, as depicted in FIG. 4, was found to reduce a HAR contact bottom critical dimension (BCD) while increasing the amorphous carbon etch rate. Depending on the embodiment, the process pressure may be varied over a wide range between about 8 mT and 50 mT with a preferred process pressure of approximately 20 mT when COS:$O_2$ gas ratio is between 0.25:1 and 1:1 with moderately low total COS/$O_2$ gas mixture flows below about 500 sccm and energized with a high frequency capacitive system, as described elsewhere herein.

The wide process window of the etchant gas mixture comprising a carbon sulfur terminal ligand energized with a high frequency RF source power enables the further addition of at least one low frequency bias power, below about 60 MHz, to further enhance the performance of the amorphous carbon layer etch. As depicted in FIG. 4, it has been found that a HAR contact has a BCD that depends both on the power level and frequency in the low RF frequency regime. Increasing power at a 13.56 MHz frequency tends to reduce BCD while increasing power at a 2 MHz frequency tending to increase BCD while increasing either has the effect of increasing amorphous carbon etch rate with little effect on bowing. In this manner, a plasma etch apparatus capable of providing both 2 MHz and 13.56 MHz frequency RF power at independently controlled power levels may advantageously provide very a tunable BCD when provided in combination with a high frequency RF source. In certain embodiments, a low frequency bias power to high frequency source power ratio is between approximately 0.25 and approximately 1:1. In particular embodiments, a low frequency bias power is provided to energize the etchant gas at power level below approximately half that of the high frequency source power. In one implementation employing a COS:$O_2$ at a ratio of between approximately 0.25:1 and approximately 1:1 at moderately low total flows and a process pressure of approximately 20 mT, the low frequency bias power to high frequency source power ratio is between approximately 0.25 and approximately 0.5 with a total power between 2000 W and 4000 W depending on chamber configuration and substrate size with a total power of at least 2000 W typical for a chamber accommodating a 200 mm substrate.

The wide process window of COS:$O_2$ permits further process tuning with hardware configurations modulating either or both of neutral and charged plasma species density across a substrate diameter. For example, in a plasma etch apparatus including a charged species tuning unit (CSTU) which applies a magnetic field of variable strength across a substrate diameter, the uniformity of BCD may be modulated to reduce a "W" or "M" characteristic across the substrate diameter. The "W" or "M" refers to a variation in the amorphous carbon etch performance across a substrate diameter, where for example a rate of BCD may be high or low at the substrate center and edge as compare to at a half radius of the substrate.

A neutral species tuning unit (NSTU), which allows a gas to be introduced into the etch chamber at different volumetric flow rates across a diameter of the wafer, may be further employed during an amorphous carbon layer etch to enlarge the BCD of a HAR contact. When used in combination, particular settings of the CTSU perform well with particular setting of the NSTU, such that a high inner to outer diameter gas flow ratio may benefit from a relatively higher inner to outer magnetic field ratio. For example, in one implementation where the $COS:O_2$ etchant gas mixture is implemented with an inner only setting of NSTU, a CSTU with a mixed inner to outer diameter magnetic flux ratio of approximately 12 G inner:8 G outer was found to provided improved across wafer etch uniformity, reducing a "W" or "M" amorphous carbon layer etch characteristic.

It is further noted that the process window is also wide regarding the substrate temperature, with good amorphous carbon etch rate and selectivity over inorganic dielectric materials possible even at room temperature. As shown in FIG. 4, the etch rate of an amorphous carbon layer may be increased by manipulating the substrate temperature. Furthermore, it is possible in an etch apparatus providing multiple temperature control zones to further tune the amorphous carbon etch rate across a substrate diameter to improve uniformity. In a particular embodiment, for example, the temperature of the substrate at a point proximate to the substrate center is controlled to first setpoint, such as 20° C. while controlling the temperature of the substrate at a point proximate to the substrate periphery to a second setpoint, such as 25° C., to improve uniformity of the amorphous carbon layer etch across a substrate.

Also advantageous, the relatively lean chemistry of $COS:O_2$ etchant gas mixtures reduce roughness caused by non-uniform polymer deposition on etched feature sidewalls. Similarly, a $COS:O_2$ etchant gas, even when mixed with additional gases, such as $N_2$, was found to provide exceptionally little chamber contamination. This was found particularly true where the plasma etch chamber includes a silicon carbide (SiC) or Yttrium material coating. A particular amorphous carbon etch process employing a $COS:O_2$ mixture was performed for approximately thirty RF hours. Following the extended process run particle counts remained low and very little etch residue was visible during inspection of the plasma etch chamber. The lean chemistry is expected to reduce the frequency of chamber cleans, increasing equipment productivity.

Returning to FIG. 1, at operation 140, the main etch is performed using the multi-layered mask patterned by embodiments of the present invention. The main etch uses the multi-layered mask to faithfully transfer a feature formed in the amorphous carbon layer 225 into the substrate layer 220, as further shown in FIG. 2E. Depending on the film, various known etch techniques and chemistries may be employed in the main etch, such as, but not limited to, a fluorocarbon-based plasma etch of a nitride or oxide substrate film. In an embodiment, the substrate film is defined with features below 80 nm using the multi-layered mask.

At operation 150, an ash or stripping process is used to remove the remainder of the multi-layered mask. In one embodiment, an in-situ strip process is performed in the same etch chamber utilized for operations 120, 125, 130, and 140. In a further embodiment, a high flow of $O_2$ is energized with a high frequency source above about 100 MHz with a power of at least 300 W while a low frequency bias power is less than 150 W. As discussed elsewhere herein, the high frequency source power will erode the amorphous carbon layer 225 at a rate not possible with low RF frequencies, such as below about 60 MHz. The in-situ strip also prepares the chamber to repeat method 100 on a subsequent substrate by removing any history effect caused by a fluorocarbon main etch of the substrate layer 220.

Figure 2F:
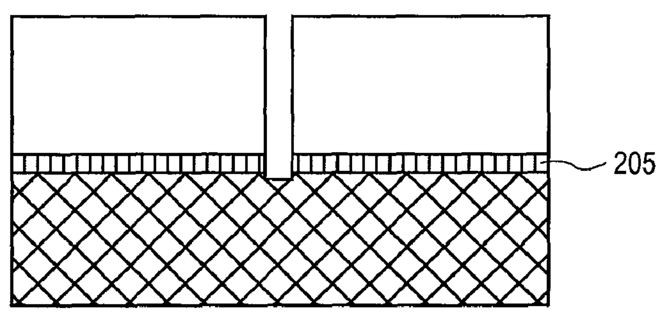

Following the amorphous carbon strip operation 150, method 100 of FIG. 1 is substantially completed and the substrate available for further processing, perhaps in the same etch chamber utilized for operations 130, 140 and 150. In a particular embodiment, as depicted in FIG. 2F, an etch stop layer 205 is etched in the same etch chamber as utilized for operation 150 to expose an underlying layer after the amorphous carbon layer 225 has been removed. In other embodiments, the substrate may be processed as conventional in the art after completion of method 100 in FIG. 1.

In an alternate embodiment, a $COS:O_2$ etchant gas mixture is employed to etch a carbonaceous layer comprising a lower wt % of carbon than the amorphous carbon layer 225 in the embodiments depicted in FIG. 1 and FIGS. 2A-2F. Such carbonaceous layers include low-k dielectric films having at least 20 wt % carbon which may be deposited by either CVD or spray-on/spin-on methods. The process conditions disclosed herein in the context of amorphous carbon films are generally applicable to these alternate embodiments employing carbonaceous films having a relatively lower carbon content, however addition of a fluorocarbon to the $COS:O_2$ etchant mixture becomes beneficial as the carbon content declines and silicon or oxygen atoms make up a greater percentage of the material composition. As a layer material transitions from that of carbonaceous layer to merely a doped oxide, conventional etch processes such as those described in the context of operation 140 become applicable.

In one embodiment, a plasma etch apparatus capable of energizing the etchant gas mixture with multiple RF frequencies, such as the Enabler™ etch chamber manufactured by Applied Materials of CA, USA. In another embodiment, the plasma etch processes of method 100 are performed in a magnetically enhanced reactive ion etcher (MERIE) etch chamber, such as the MxP®, MxP+™, Super-E™ or E-MAX® chamber also manufactured by Applied Materials of CA, USA. Other types of high performance etch chambers known in the art may also be used, for example, chambers in which a plasma is formed using inductive techniques.

Figure 3:
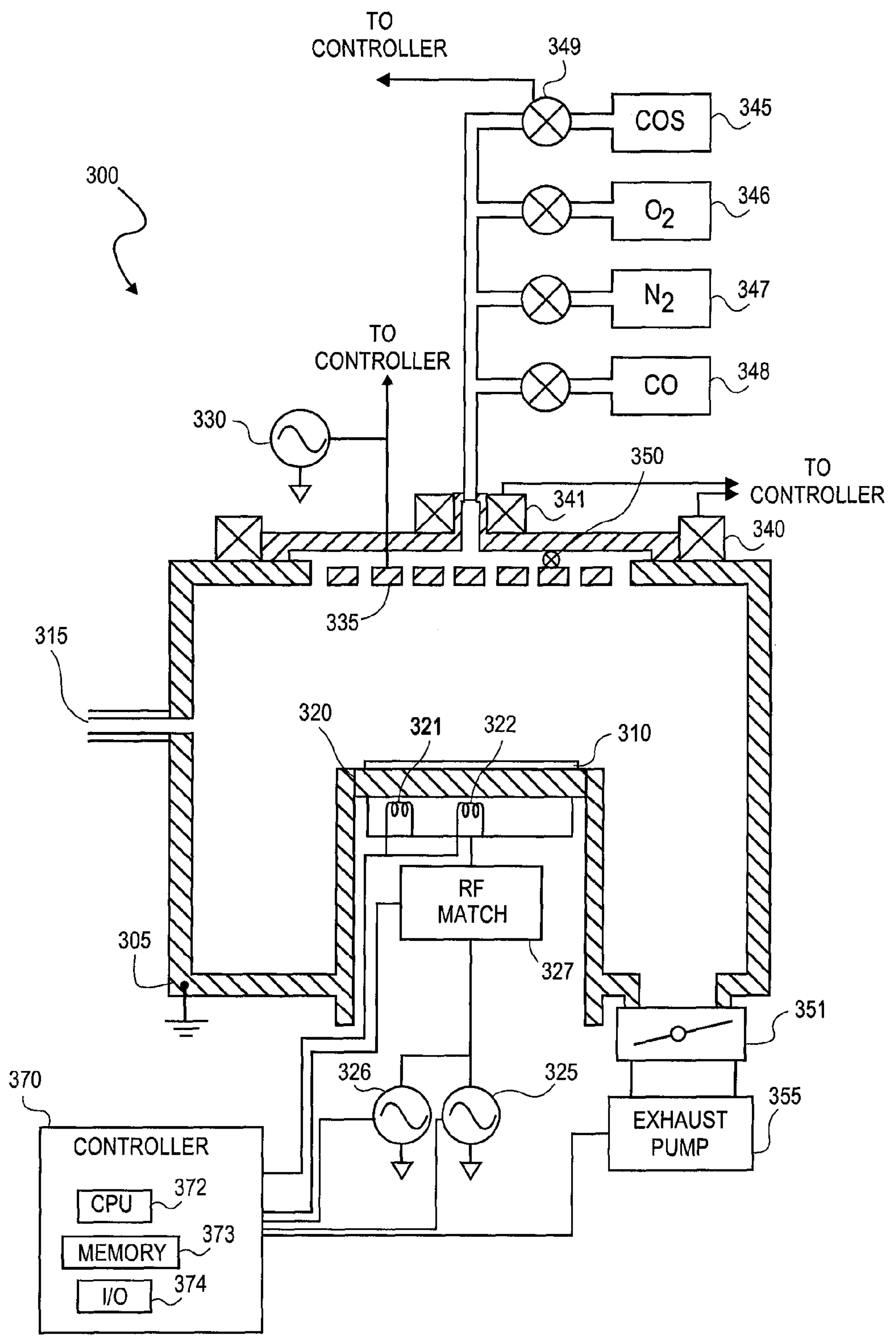
FIG. 3 is a cross-sectional illustration of a plasma etch apparatus configured to perform etch methods in accordance with an embodiment.

A cross-sectional view of an exemplary multi-frequency etch system 300 is shown in FIG. 3. System 300 includes a grounded chamber 305. A substrate 310 is loaded through an opening 315 and clamped to a temperature controlled cathode 320. In particular embodiments, temperature controlled cathode 320 include a plurality of zones, each zone independently controllable to a temperature setpoint, such as with a first thermal zone 322 proximate a center of substrate 310 and a second thermal zone 321 proximate to a periphery of substrate 310. Process gases, are supplied from gas sources 345, 346, 347 and 348 through respective mass flow controllers 349 to the interior of the chamber 305. In certain embodiments, a NSTU 350 provides for a controllable inner to outer diameter gas flow ratio whereby process gases, such as a $COS/O_2$ etchant gas mixture, may be provided at a higher flow rate proximate to a center of substrate 310 or proximate a periphery of substrate 310 for tuning of the neutral species concentration across the diameter of substrate 310. Chamber 305 is evacuated to between 5 mTorr and 500 mTorr via an exhaust valve 351 connected to a high capacity vacuum pump stack 355 including a turbo molecular pump.

When RF power is applied, a plasma is formed in chamber processing region over substrate 310. Bias power RF generator 325 is coupled to cathode 320. Bias power RF generator 325 provides bias power to further energize the plasma. Bias power RF generator 325 typically has a low frequency between about 2 MHz to 60 MHz, and in a particular embodiment, is in the 13.56 MHz band. In certain embodiments, the plasma etch system 300 includes a third bias power RF generator 326 at a frequency at about the 2 MHz band which is connected to the same RF match 327 as bias power RF generator 325. Source power RF generator 330 is coupled through a match (not depicted) to a plasma generating element 335 which may be anodic relative to cathode 320 to provide high frequency source power to energize the plasma. Source RF generator 330 typically has a higher frequency than the bias RF generator 325, such as between 100 and 180 MHz, and in a particular embodiment, is in the 162 MHz band. Bias power affects the bias voltage on substrate 310, controlling ion bombardment of the substrate 310, while source power affects the plasma density relatively independently of the bias on substrate 310. It is noted that the etch performance of a given set of input gases from which the plasma is generated varies significantly with a plasma density and wafer bias, thus both the amount and frequency of power energizing the plasma are important. Because substrate diameters have progressed over time, from 150 mm, 200 mm, 300 mm, etc., it is common in the art to normalize the source and bias power of a plasma etch system to the substrate area.

In particular embodiments, the plasma etch chamber includes a CSTU for a controlling inner and out diameter magnetic field strength ratio to control the density of charged species in the plasma across the diameter of the substrate 310. One exemplary CSTU includes the magnetic coil 340 proximate a periphery of the substrate 310 and the magnetic coil 341 proximate a center of the substrate 310 to provide a magnetic field of between 0 G and about 25 G in either or both of an inner zone and outer zone of the chamber 305.

In an embodiment of the present invention, system 300 is computer controlled by controller 370 to control the low frequency bias power, high frequency source power, CSTU inner to outer magnetic field ratio, etchant gas flows and NSTU inner to outer flow ratios, process pressure and cathode temperatures, as well as other process parameters. Controller 370 may be one of any form of general-purpose data processing system that can be used in an industrial setting for controlling the various subprocessors and subcontrollers. Generally, controller 370 includes a central processing unit (CPU) 372 in communication with memory 373 and input/output (I/O) circuitry 374, among other common components. Software commands executed by CPU 372, cause system 300 to, for example, load the substrate into a plasma etch chamber, introduce an etchant gas mixture including $O_2$ and a gas comprising a carbon sulfur terminal ligand, such as COS, into the plasma etch chamber and etch a carbonaceous layer with a plasma of the etchant gas mixture. Other processes, such as etching an inorganic dielectric cap layer over an amorphous carbon layer and etching a silicon dioxide dielectric under an amorphous carbon layer, in accordance with the present invention, may also be executed by the controller 370. Portions of the present invention may be provided as a computer program product, which may include a computer-readable medium having stored thereon instructions, which may be used to program a computer (or other electronic devices) to load a substrate into a plasma etch chamber, introduce an etchant gas mixture including $O_2$ and a gas comprising a carbon sulfur terminal ligand, such as COS, into the plasma etch chamber and etch an amorphous carbon layer with a plasma of the etchant gas mixture, in accordance with the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable storage medium suitable for storing electronic instructions. Moreover, the present invention may also be downloaded as a program file containing a computer program product, wherein the program file may be transferred from a remote computer to a requesting computer.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of etching a feature in a carbonaceous layer comprising at least 20 wt % carbon, the method comprising:

providing a substrate including the carbonaceous layer;

loading the substrate into a plasma etch chamber;

introducing an etchant gas mixture including $O_2$ and a gas comprising a carbon sulfur terminal ligand into the plasma etch chamber;

etching the carbonaceous layer with a plasma of the etchant gas mixture energized with a high frequency RF source having a RF frequency above 100 MHz.

2. The method of claim 1, wherein the carbonaceous layer is an amorphous carbon layer comprising at least 50 wt % carbon.

3. The method of claim 1, wherein the gas comprising a carbon sulfur terminal ligand is selected from the group consisting of: COS, $SCOR_2$, $SCORNR_2$, $SCR_2$, $SCRNR_2$, $SC(NR)_2$, SCNR, $SC(OR)_2$, wherein R is one of an alkyl group, an aryl group, or hydrogen.

4. The method of claim 1, wherein the gas comprising a carbon sulfur terminal ligand is carbonyl sulfide (COS) and a $COS:O_2$ volumetric flow rate ratio is between about 0.25 and about 1.0.

5. The method of claim 1, wherein the etchant gas mixture consists essentially of COS and $O_2$.

6. The method of claim 1, wherein the etchant gas mixture further comprises at least one of $N_2$, $O_3$, $H_2O$, $H_2O_2$, CO or $CO_2$.

7. The method of claim 1, wherein the etchant gas mixture is energized with one or more low frequency RF generator having a frequency below 60 MHz, wherein the one or more low frequency generator delivers less than half as much power to the plasma as that of the high frequency RF source.

8. The method of claim 1, wherein the etchant gas mixture is delivered to the plasma etch chamber with a higher gas flow rate at a first gas inlet proximate to the substrate center than at a second gas inlet proximate to the substrate periphery while the plasma is exposed to a higher magnetic field proximate to the substrate center than proximate to the substrate periphery to improve uniformity of the carbonaceous layer etch.

9. The method of claim 1, further comprising:

controlling the temperature of the substrate at a point proximate to the substrate center at a first setpoint while controlling the temperature of the substrate at a point proximate to the substrate periphery at a second setpoint, different than the first to improve uniformity of the carbonaceous layer etch.

10. The method of claim 1, further comprising:

etching the carbonaceous layer with a first etch step with the plasma including the gas comprising the carbon sulfur terminal ligand; and etching the carbonaceous layer with a second etch step, subsequent to the first etch step, the second etch step providing a plasma of an etchant gas mixture comprising $N_2$ and $O_2$ and substantially free of the gas comprising the carbon sulfur terminal ligand.

11. A computer-readable medium having stored thereon a set of machine-executable instructions which, when executed by a data-processing system, cause a system to perform the method of claim 1.

12. The computer-readable medium of claim 11, wherein the gas comprising a carbon sulfur terminal ligand is carbonyl sulfide (COS) and wherein the instructions cause the system to introduce COS to the plasma etch chamber at a volumetric flow rate ratio between about 0.25 and about 1.0.

13. A method of etching an amorphous carbon layer comprising at least 50 wt % carbon, comprising:

providing a substrate including a multi-layered mask on a substrate layer, the multi-layered mask comprising:

the amorphous carbon layer disposed on the substrate layer;

an inorganic dielectric cap layer disposed on the amorphous carbon layer;

and a patterned photoresist layer disposed over the inorganic dielectric cap layer;

loading the substrate into a plasma etch chamber;

introducing an etchant gas mixture including $O_2$ and a gas comprising a carbon sulfur terminal ligand into the plasma etch chamber;

etching the amorphous carbon layer with a plasma of the etchant gas mixture.

14. The method of claim 13, wherein the etch gas mixture is energized with a high frequency RF source having an RF frequency above 100 MHz.

15. The method of claim 13, wherein the gas comprising a carbon sulfur terminal ligand is carbonyl sulfide (COS) and a $COS:O_2$ volumetric flow rate ratio is between about 0.25 and about 1.0.

16. The method of claim 13, further comprising:

etching the substrate layer with a fluorocarbon gas; and stripping the amorphous carbon layer with a plasma energized with the high frequency RF generator after etching the substrate layer.

17. The method of claim 13, further comprising:

etching the inorganic dielectric cap layer with a fluorocarbon gas energized with one or more low frequency RF generators having a frequency below about 60 MHz without applying high frequency RF energy having a frequency above about 100 MHz to the plasma;

purging the plasma etch chamber of the fluorocarbon gas; and etching the amorphous carbon layer with the etchant gas mixture energized with a high frequency RF generator having a frequency above about 100 MHz.

18. The method of claim 17, wherein the etchant gas mixture energized with the high frequency RF generator is further energized with the one or more low frequency RF generator, wherein the one or more low frequency generator delivers less than half as much power to the plasma as that of the high frequency RF generator.

* * * * *